(12) United States Patent
Reber et al.

(10) Patent No.: US 10,204,860 B2
(45) Date of Patent: Feb. 12, 2019

(54) SEMICONDUCTOR DEVICE WITH GRAPHENE ENCAPSULATED METAL AND METHOD THEREFOR

(71) Applicant: NXP USA, INC., Austin, TX (US)

(72) Inventors: Douglas M. Reber, Austin, TX (US); Mehul D. Shroff, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/463,048

(22) Filed: Mar. 20, 2017

(65) Prior Publication Data

US 2017/0194264 A1   Jul. 6, 2017

Related U.S. Application Data

(62) Division of application No. 14/856,772, filed on Sep. 17, 2015, now Pat. No. 9,640,430.

(51) Int. Cl.
| | |
|---|---|
| *H01L 23/532* | (2006.01) |
| *H01L 21/768* | (2006.01) |
| *H01L 21/285* | (2006.01) |
| *H01L 23/522* | (2006.01) |

(52) U.S. Cl.
CPC .. *H01L 23/53276* (2013.01); *H01L 21/28506* (2013.01); *H01L 21/76802* (2013.01); *H01L 21/76838* (2013.01); *H01L 21/76852* (2013.01); *H01L 21/76867* (2013.01); *H01L 21/76877* (2013.01); *H01L 23/5226* (2013.01); *H01L 23/53209* (2013.01); *H01L 23/53214* (2013.01); *H01L 23/53266* (2013.01)

(58) Field of Classification Search
CPC .................. H01L 23/53276; H01L 2221/1094
See application file for complete search history.

(56) References Cited

U.S. PATENT DOCUMENTS

| | | | | |
|---|---|---|---|---|
| 8,610,278 B1 * | 12/2013 | Ott | ...................... | H01L 23/5222 257/379 |
| 2011/0215300 A1 * | 9/2011 | Guo | ..................... | H01L 27/0688 257/29 |
| 2014/0084250 A1 * | 3/2014 | Wada | ................ | H01L 23/53276 257/29 |

\* cited by examiner

*Primary Examiner* — Marc Armand
*Assistant Examiner* — Sarah Salerno

(57) ABSTRACT

A method for forming a semiconductor structure includes forming a first metal layer over a first dielectric layer, forming a first graphene layer on at least one major surface of the first metal layer, and forming a second dielectric layer over the first metal layer and the first graphene layer. The method further includes forming an opening in the second dielectric layer which exposes the first metal layer, forming a second metal layer over the second dielectric layer and within the opening, and forming a second graphene layer on at least one major surface of the second metal layer, wherein the second graphene layer is also formed within the opening.

12 Claims, 9 Drawing Sheets

SEMICONDUCTOR DEVICE WITH GRAPHENE ENCAPSULATED METAL AND METHOD THEREFOR

This application is a divisional application of a U.S. patent application entitled "Semiconductor Device With Graphene Encapsulated Metal and Method Therefor", having a serial number of Ser. No. 14/856,772, having a filing date of Sep. 17, 2015, having common inventors, and having a common assignee, all of which is incorporated by reference in its entirety.

BACKGROUND

Field

This disclosure relates generally to semiconductor processing, and more specifically, to a semiconductor device with graphene encapsulated metal and methods for forming.

Related Art

As semiconductor technology advances, semiconductor devices continue to decrease in size. In conventional semiconductor device processing, barrier layers, such as tantalum nitride, are commonly used for interconnects in a semiconductor device to prevent the interconnect metal, such as copper, from reacting with the interlayer dielectrics. However, as sizes continue to shrink, the barrier layer thickness becomes a significant portion of the line width of the interconnect which increases the resistance of the interconnect. Therefore, a need exists for improved metal interconnects.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A metal having a surrounding graphene layer operates as a metal interconnect in a semiconductor structure. With the graphene, an additional barrier layer, such as TiN or TaN, is not needed if the metal chosen for the interconnect does not react with the interlayer dielectrics. For example, nickel surrounded by a graphene layer does not need a barrier layer since nickel does not react with silicon dioxide or low-k dielectrics (where k is the dielectric constant). While nickel has reduced conductivity as compared to copper, which is typically chosen as an interconnect metal, the conductivity of nickel is compensated with the higher conductivity of graphene. Furthermore, while copper has higher conductivity, a barrier layer is required, which, depending on its thickness as compared to the copper, can increase resistivity.

Figure 1:
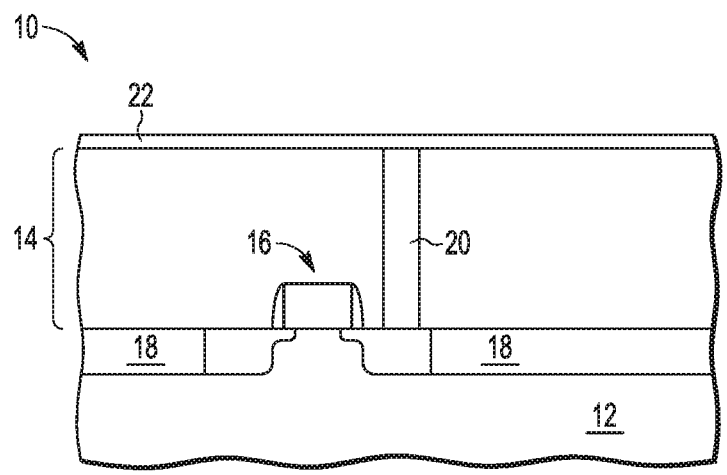
FIGS. 1-10 illustrate a semiconductor structure at various stages in processing, in accordance with one embodiment of the present invention.

FIG. 1 illustrates, in cross-sectional form, a semiconductor structure 10 at a stage in processing. Structure 10 includes a substrate 12 having a plurality of devices formed on an in substrate 12, such as device 16. The devices are isolated by isolation regions, such as isolation regions 18. Structure 10 includes an interlayer dielectric layer (ILD) 14 over the devices. ILD 14 may be a silicon dioxide layer. Structure 10 includes a contact 20 extending through ILD 14 to a source/drain region of device 16. Note that other contacts may be formed to other portions of device 16 or to other devices. A metal layer 22 is formed over ILD 14. In one embodiment, metal layer 22 is nickel, and is blanket deposited over ILD 14. In alternate embodiments metal layer 22 may be titanium, aluminum, or tungsten. Semiconductor substrate 12 described herein can be any semiconductor material or combinations of materials, such as gallium arsenide, silicon germanium, silicon-on-insulator (SOI), silicon, monocrystalline silicon, the like, and combinations of the above.

Figure 2:
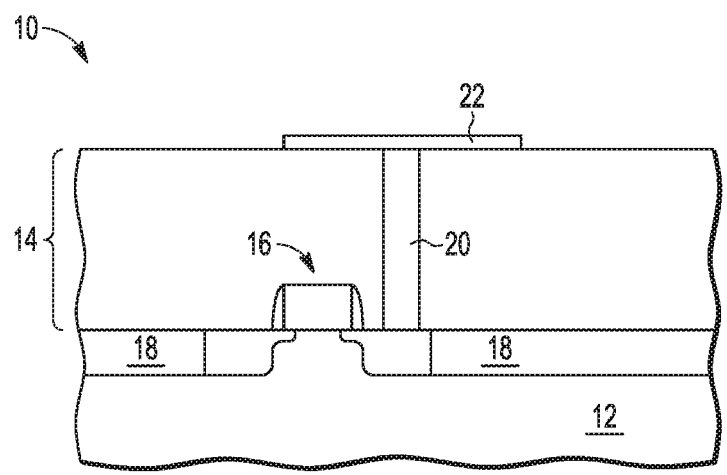

FIG. 2 illustrates, in cross-sectional form, semiconductor structure 10 at a subsequent stage in processing. Metal layer 22 is patterned, using, for example, a patterned masking layer, such as photoresist. Metal layer 22 is patterned, as needed, to form metal portion 22 within a metal interconnect layer. Metal portion 22 is a metal interconnect which can route signals as needed with the metal interconnect layer.

Figure 3:
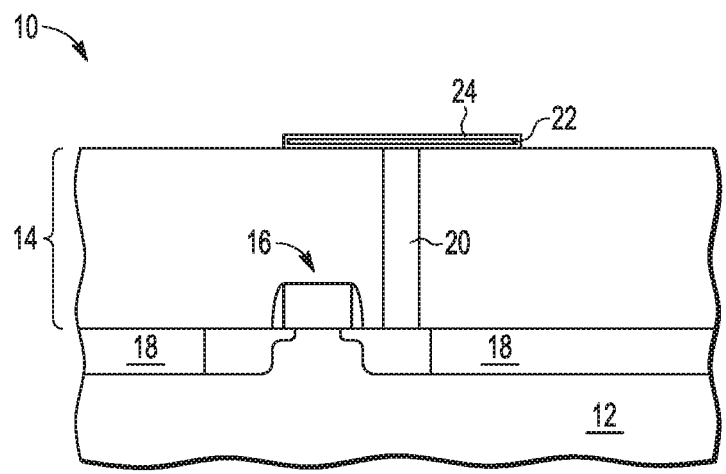

FIG. 3 illustrates, in cross-sectional form, semiconductor structure 10 at a subsequent stage in processing. A graphene layer 24 is formed such that it surrounds the patterned metal portion 22. For the discussions herein, it will be assumed that metal portion 22 is nickel. In one embodiment, to form graphene layer 24, metal portion 22 is exposed to a growth process using a carbon-containing film such as acetylene or other carbon-containing gas. The carbon-containing gas may be part of a plasma, remote plasma, or chemical reaction process such that elemental carbon or carbon ions interact with the nickel. The carbon diffuses through the nickel and forms graphene on the outer surfaces of the nickel, once the carbon reaches its solid solubility limit in nickel. Excess carbon, which may not be in graphene form, such as graphite, is removed chemically, such as with the use of a plasma etch. Alternatively, to form graphene layer 24, metal portion 22 is exposed to a plasma with some hydrogen and controlled amounts of methane. In another embodiment, to form graphene layer 24, metal portion 22 is exposed to a carbon-containing paste. Another embodiment for the formation of graphene will be discussed in reference to FIGS. 11-16 below. The formation of graphene in any of these embodiments can be performed at room temperature. In one embodiment, the graphene formation is performed at a temperature of −20 to 500 degrees Celsius. In one embodiment, it can be performed at a temperature in a range of 100 to 250 degrees Celsius.

Figure 4:
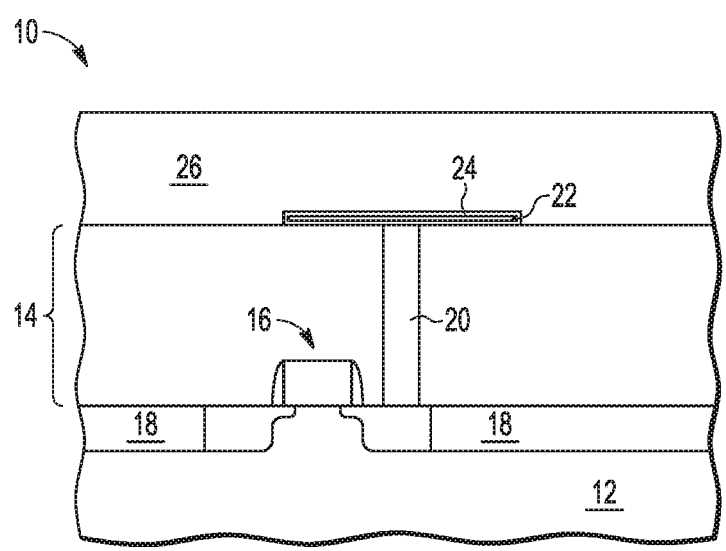

FIG. 4 illustrates, in cross-sectional form, semiconductor structure 10 at a subsequent stage in processing. An ILD 26 is formed over metal portion 22 and ILD 14. In one embodiment, ILD 36 may subsequently be planarized.

Figure 5:
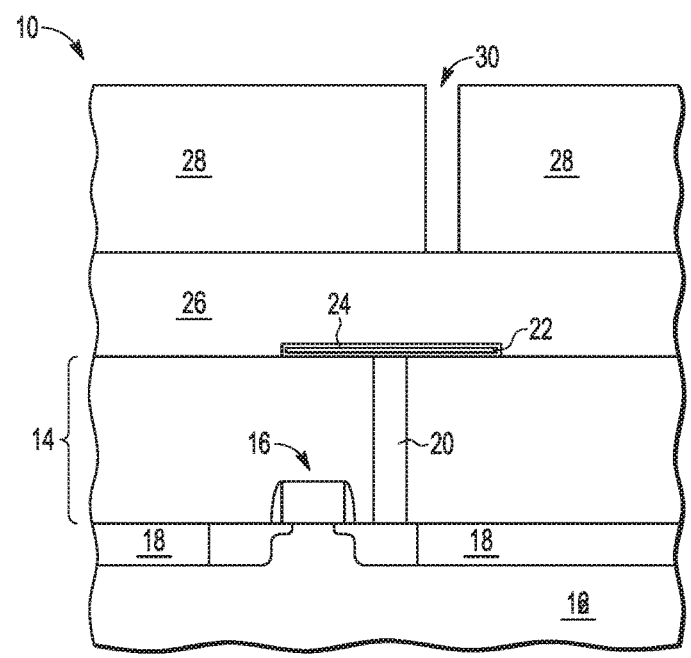

FIG. 5 illustrates, in cross-sectional form, semiconductor structure 10 at a subsequent stage in processing. A patterned masking layer 28 is formed over ILD 26 which includes an opening 30 which his located over metal portion 22. That is, patterned masking layer defines a location where a conductive via will be formed to contact metal portion 22. In one embodiment, patterned masking layer 28 is photo resist.

Figure 6:
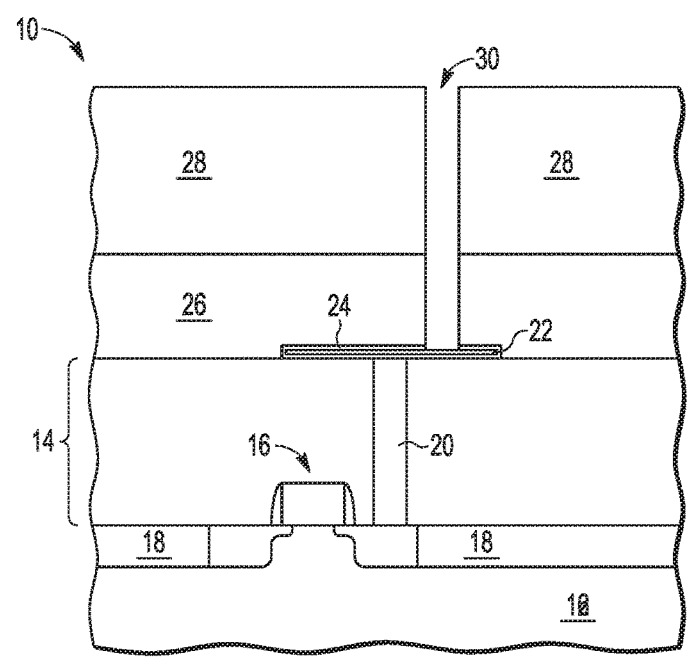

FIG. 6 illustrates, in cross-sectional form, semiconductor structure 10 at a subsequent stage in processing. Opening 30 is extended through ILD 26 and through graphene 24 to form a via opening which exposes metal portion 22. An etch can be performed to extend opening 30 through ILD 26 to stop on metal portion 22. An etch stop layer is not needed if there is sufficient selectivity with the metal of metal portion 22, such as when metal portion 22 is nickel.

Figure 7:
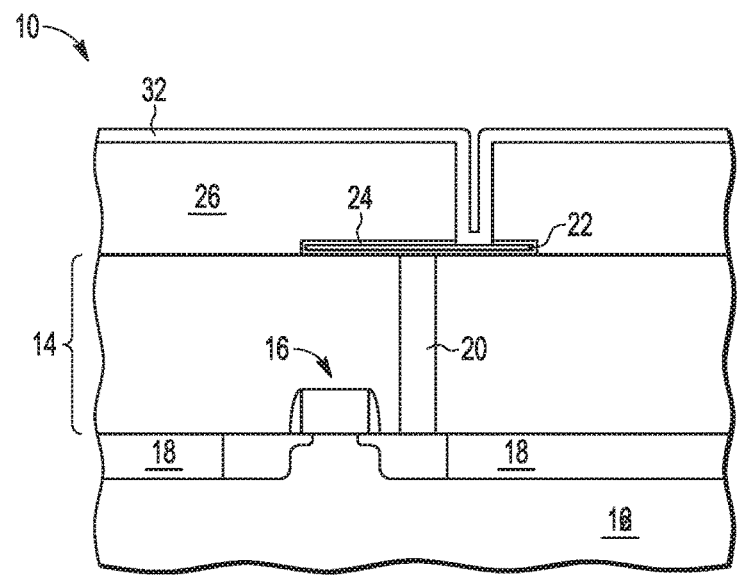

FIG. 7 illustrates, in cross-sectional form, semiconductor structure 10 at a subsequent stage in processing. A metal layer 32 is formed, such as by blanket deposition, over ILD 26 and within opening 30. Note that in one embodiment, metal layer 32 is sufficiently thin that it does not fill opening 30. In an alternate embodiment, metal layer 32 may be sufficiently thick to fill opening 30. In one embodiment, metal layer 32, like metal portion 22, is nickel.

Figure 8:
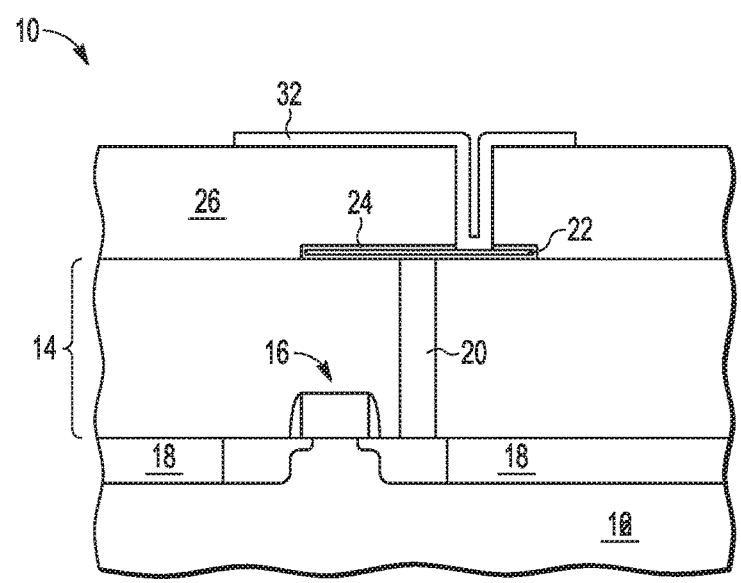

FIG. 8 illustrates, in cross-sectional form, semiconductor structure 10 at a subsequent stage in processing. Metal layer 32 is patterned to result in a patterned metal portion 32 which operates as a metal interconnect to route signals between metal portion 22 to connections in the next metal interconnect layer.

Figure 9:
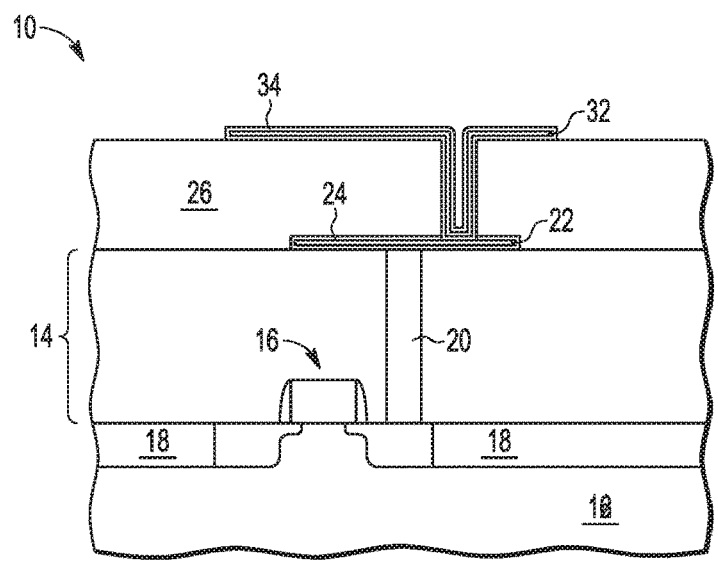

FIG. 9 illustrates, in cross-sectional form, semiconductor structure 10 at a subsequent stage in processing. A graphene layer 36 is formed such that it surrounds the patterned metal portion 32. For the discussions herein, it will be assumed that metal portion 32 is nickel, and any technique used to form graphene layer 24 discussed herein can be used to form graphene layer 36. Note that there is no barrier layer formed within opening 30. In this manner, graphene layer 24 is in contact with graphene layer 36 within opening 30.

Figure 10:
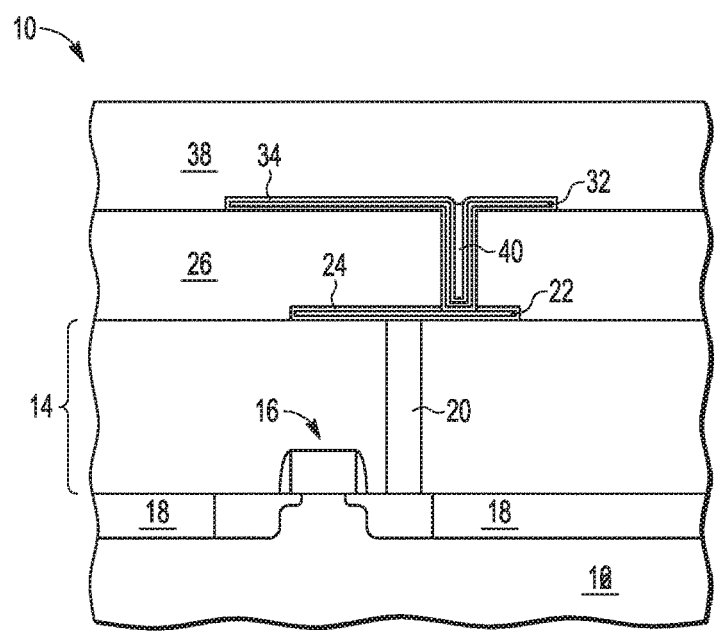

FIG. 10 illustrates, in cross-sectional form, semiconductor structure 10 at a subsequent stage in processing. An ILD 38 is formed over metal portion 32 and ILD 26. Note that if metal portion 32 does not fill opening 30, ILD 30 may leave a void 40 within opening 30 that does not get filled in. The void is located between ILD 38 and the section of metal portion 32 which extends through ILD 26 in opening 30. Alternatively, ILD 38 completely fills opening 30. In one embodiment, ILD 38 may subsequently be planarized.

Note that in this manner, metal layers can be patterned to form metal interconnects, such as metal portions 22 and 32, to route signals as needed within structure 10. A graphene layer is formed surrounding these metal portions to improve conductivity of the metal portions, which allows the metal portions to be formed of nickel (which has a higher resistivity than copper). The graphene-surrounded metal portions can be used in any metal layer of structure 10, from metal layer 0 to the final metal layer. That is, the illustrated embodiments illustrate metal portions 22 and 32 in a particular metal layer as an example.

Figure 11:
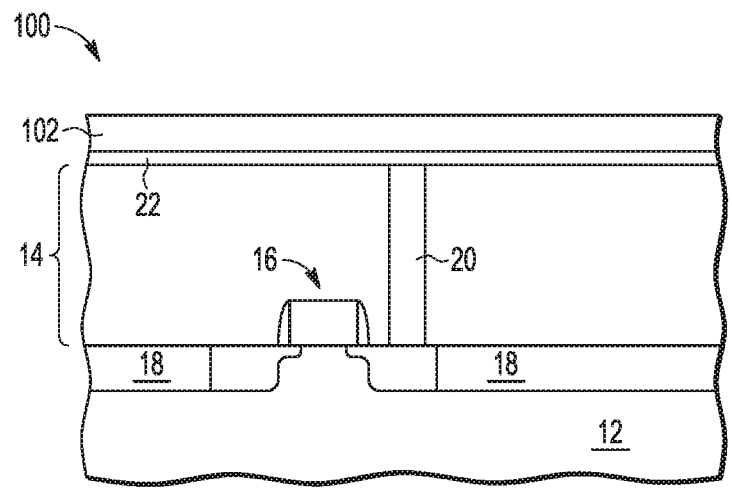
FIGS. 11-16 illustrate a semiconductor structure at various stages in processing, in accordance with one embodiment of the present invention.

FIGS. 11-16 illustrate the formation of graphene layer 24 in accordance with an alternate embodiment of the present invention. FIG. 11 illustrates a structure 100 at a stage in processing in which like numerals with structure 10 indicate like elements. Note that in FIG. 11, metal layer 22 has not yet been patterned, and it is again assumed metal layer 22 is nickel. After formation of metal layer 22, an amorphous carbon anti-reflective coating (ARC) layer 102 is formed over metal layer 22. In embodiment, ARC layer 102 is blanket deposited over metal layer 22.

Figure 12:
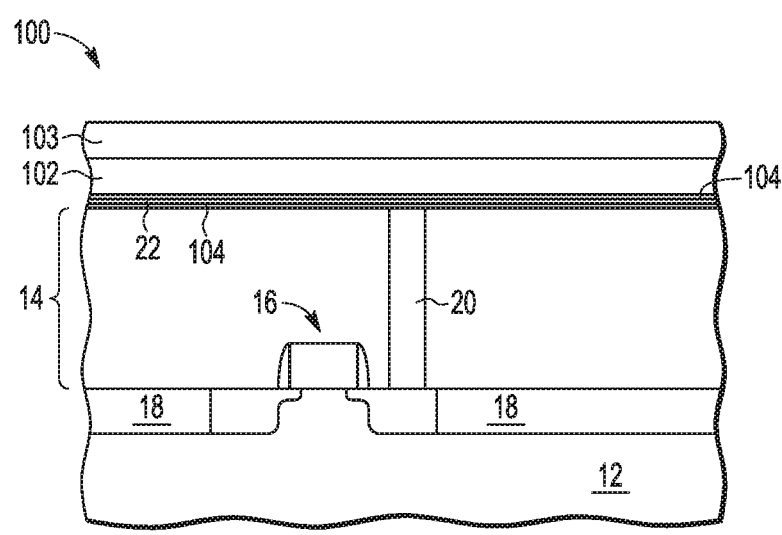

FIG. 12 illustrates, in cross-sectional form, semiconductor structure 100 at a subsequent stage in processing. ARC layer 102 is a carbon layer or a carbon-containing layer in which, during deposition, the carbon drives into the nickel, thus forming a graphene layer 104 at the major surfaces of metal layer 22. In one embodiment, graphene layer 104 is fully formed during the deposition of ARC layer 102. In an alternate embodiment, after deposition of ARC layer 102, structure 100 can be exposed to a high temperature to drive the carbon into the nickel to form graphene layer 104. This temperature may be in a range of 100 to 500 degrees Celsius.

Figure 13:
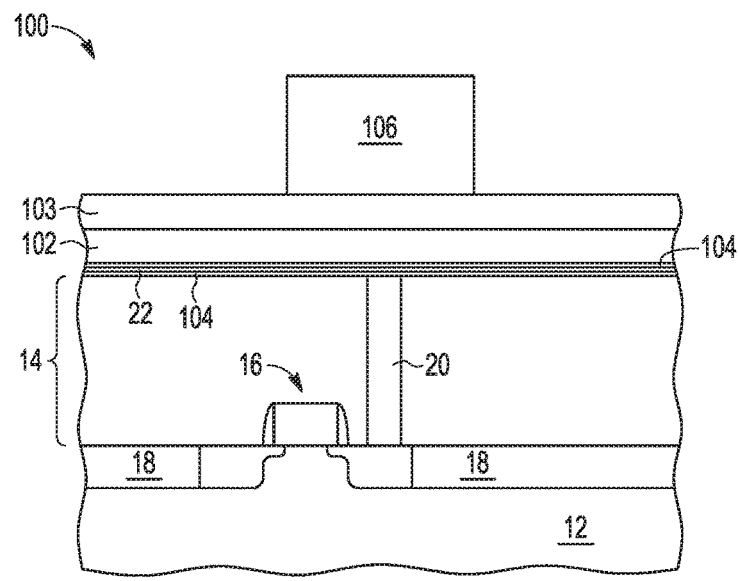

FIG. 13 illustrates, in cross-sectional form, semiconductor structure 100 at a subsequent stage in processing. An oxide layer 103 is formed over ARC layer 102, and a patterned masking layer 106 is formed over oxide layer 103. In one embodiment, oxide layer 103 is an oxide formed using tetraethyl orthosilicate (TEOS). Patterned masking layer 106 may be photoresist, and it corresponds to portion of metal layer 22 which will remain to form a metal interconnect.

Figure 14:
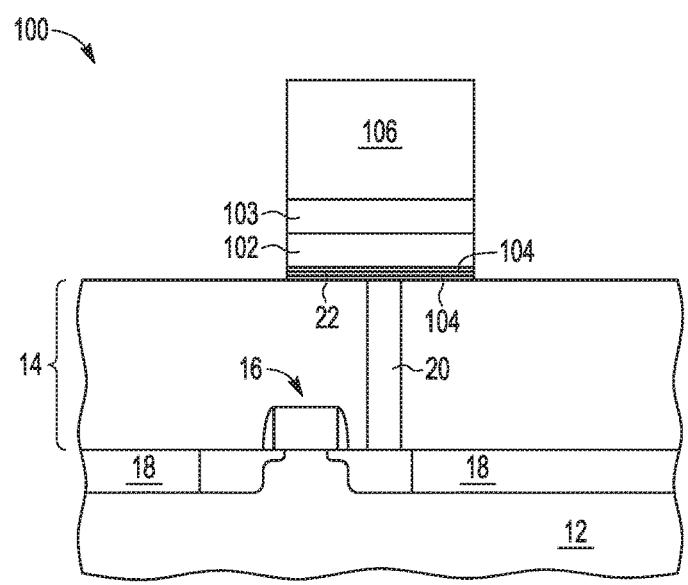

FIG. 14 illustrates, in cross-sectional form, semiconductor structure 100 at a subsequent stage in processing. Metal layer 22, graphene 104, ARC layer 102, and oxide layer 103 are all patterned using patterned masking layer 106. Therefore, ILD 14 is exposed on either side of patterned masking layer 106.

Figure 15:
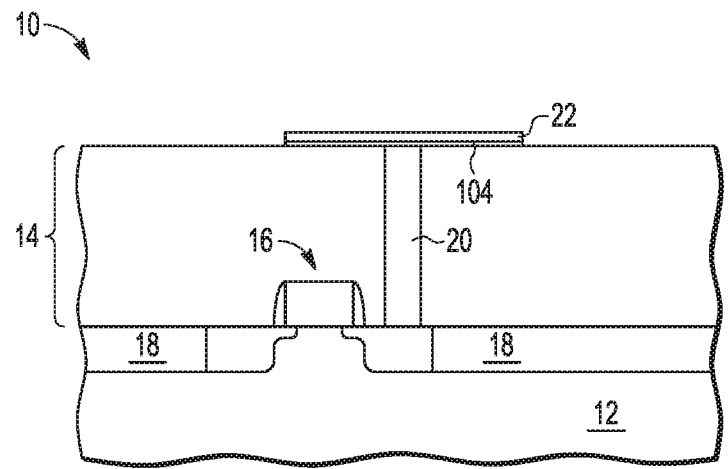

FIG. 15 illustrates, in cross-sectional form, semiconductor structure 100 at a subsequent stage in processing. Patterned masking layer 106 is removed. After removal of patterned masking layer 106, an additional carbon driving step may be performed. For example, structure 100 may be exposed to a high temperature, such as 100 to 500 degrees Celsius, to further drive carbon into the nickel. Alternatively, the additional carbon driving may not be performed. Oxide layer 103 and ARC layer 102 are then removed. Removal of these layers also removes graphene 104 from the top surface of remaining metal portion 22. Therefore, graphene 104 only remains between metal portion 22 and ILD 14, and not on the top surface or side surfaces of metal portion 22.

Figure 16:
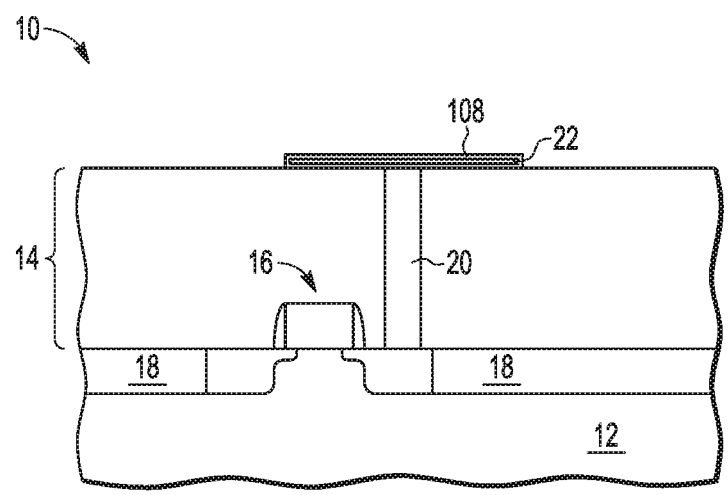

FIG. 16 illustrates, in cross-sectional form, semiconductor structure 100 at a subsequent stage in processing. Since the graphene is removed from the top and side surfaces of metal portion 22, a graphene layer 108 can again be formed surrounding metal portion 22. In this case, graphene layer 108 is formed by exposing semiconductor structure 100 to a high temperature, such as 100 to 500 degrees Celsius. However, unlike the formation of graphene layer 104, for the formation of graphene layer 108, a carbon source, such as a plasma or paste, is not necessary because there is already carbon infused in the nickel previously provided by ARC layer 102. Graphene layer 108 is formed on the top surface and side surfaces of metal portion 22. Therefore, graphene layer 104 therefore becomes a part of graphene layer 108 which surrounds metal portion 22. In an alternate embodiment, graphene layer 108 may not be formed, and only graphene layer 104 would remain. In this case, a graphene layer would be formed on only one major surface of metal portion 22.

Processing can continue, as described above with FIGS. 4-10 to form additional metal interconnects in any metal layer as needed. For example, an ILD layer can be formed over metal portion 22 and ILD 14, with a via opening formed therein. In this via opening, another metal layer can be formed, with graphene surrounding the metal layer or below the metal layer using the processes described with respect to FIGS. 11-16. This metal layer may be used to form a metal interconnect with a conductive via extending through the ILD, similar to metal portion 32 and graphene layer 36 of FIG. 9. Although the graphene layer may be formed on only the bottom major surface of a metal interconnect (such as if no additional carbon driving step is performed to form graphene layer 108), the use of graphene still reduces the resistivity of the nickel. Also, no barrier is needed within via openings. In via openings, the graphene layer on the bottom surface of the metal interconnect would directly contact the underlying metal interconnect. Note that the use of ARC layer 102 can prevent reflective notching due to the surface topography of the via openings.

Figure 17:
FIG. 17 illustrates a semiconductor structure in accordance with one embodiment of the present invention.

FIG. 17 illustrates, in cross-sectional form, a semiconductor structure 50 including a number of graphene-cladded metal layers. That is, for each metal layer surrounded with graphene (as in FIGS. 1-10), or having a graphene layer on a least one major surface of the metal layer (as in FIGS. 11-16 without the additional graphene formation after removal of the ARC layer), more than one layer may be formed. For example, as illustrated in FIG. 17, each metal layer described above can be formed as a stack of 4 metal layers (or any number greater than one). Structure 50 includes metal layers 52, 56, 60, and 64, each surrounded by a corresponding graphene layer 54, 58, 62, and 66. In one embodiment, alternating layers are formed of different metals. For example, metal layers 52 and 60 may be nickel and metal layers 56 and 64 may be aluminum. Any of the methods described above to form a graphene layer on or surrounding the metal layer may be used to form structure 50.

Therefore, by now it can be understood how a graphene layer can be formed in combination with a metal interconnect within a semiconductor structure. The graphene allows the use of metals which may have reduced conductivity as compared to copper, such as nickel, because the graphene compensates for some of the loss conductivity. Furthermore, by allowing for the use of other metals, such as nickel, for the metal interconnects, barrier layers may be omitted thus resulting in reduced resistivity.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, any number of metal layers with graphene of the same or different types of metal may be used to form each metal interconnect of a semiconductor structure. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a method for forming a semiconductor structure includes forming a first metal layer over a first dielectric layer; forming a first graphene layer on at least one major surface of the first metal layer; forming a second dielectric layer over the first metal layer and the first graphene layer; forming an opening in the second dielectric layer which exposes the first metal layer; forming a second metal layer over the second dielectric layer and within the opening; and forming a second graphene layer on at least one major surface of the second metal layer, wherein the second graphene layer is also formed within the opening. In one aspect of the embodiment, the first metal layer and the second metal layer comprise nickel. In another aspect, forming the first graphene layer on at least one major surface of the first metal layer includes exposing the first metal layer to a carbon-containing gas such that the carbon diffuses through the first metal layer to form the first graphene layer surrounding the first metal layer. In another aspect, forming the first graphene layer on at least one major surface of the first metal layer includes exposing the first metal layer to a carbon-containing paste such that the carbon diffuses through the first metal layer to form the first graphene layer surrounding the first metal layer. In another aspect, forming the first graphene layer on at least one major surface of the first metal layer includes forming an anti-reflective coating (ARC) layer over the first metal layer, wherein the ARC layer comprises carbon; and exposing the semiconductor structure to a temperature of at least −20 degrees Celsius such that the carbon is driven into the first metal layer from the ARC layer. In a further aspect, forming the first graphene layer on at least one major surface of the first metal layer include removing the ARC layer, wherein removing the ARC layer comprises removing the first graphene layer from a top surface of the first metal layer. In yet a further aspect, forming the first graphene layer on at least one major surface of the first metal layer includes after removing the first graphene layer from the top surface of the metal layer, exposing the semiconductor structure to a temperature of at least −20 degrees Celsius to form a third graphene layer on the top surface and side surfaces of the metal layer. In another aspect, the second metal layer and the second graphene layer do not completely fill the opening. In a further aspect, the method further includes forming a third dielectric layer over the second metal layer, the second graphene layer, and the opening, wherein a void is formed in the opening after formation of the third dielectric layer. In another aspect, the first graphene layer surrounds the first metal layer, and prior to forming the second dielectric layer, the method further includes forming a third metal layer over the first graphene layer; and forming a third graphene layer on at least one major surface of the third metal layer, wherein the first metal layer and the third metal layer are each a different metal and are separated by graphene. In a further aspect, the first metal layer is one of nickel, aluminum, titanium, or tungsten and the third metal layer is another one of nickel, aluminum, titanium, or tungsten. In another aspect, the first graphene layer surrounds the first metal layer and the second graphene layer surrounds the second metal layer, wherein the first graphene layer contacts the second graphene layer in the opening.

In another embodiment, a semiconductor structure includes a first metal interconnect over a first dielectric layer; a first graphene layer on at least one major surface of the first metal interconnect; a second dielectric layer over the graphene layer and the first metal interconnect; a second metal interconnect over the second dielectric layer and extending through the second dielectric layer to electrically contact the first metal interconnect; and a second graphene layer on at least one major surface of the second metal interconnect. In one aspect of the another embodiment, the first metal interconnect and second metal interconnect comprise nickel. In another aspect, the semiconductor structure further includes a third dielectric layer over the second metal interconnect and second graphene layer; and a void between the third dielectric layer and a portion of the second metal interconnect which extends to the electrically contact the first metal layer. In another aspect, the first graphene layer surrounds the first metal interconnect and the second graphene layer surrounds the second metal interconnect. In a further aspect, the structure further includes a third metal interconnect with a third graphene layer surrounding the third metal interconnect, wherein the third graphene layer is on the first graphene layer, and wherein the first metal and the third metal are different metals. In another further aspect, the first metal interconnect is one of nickel or aluminum and the third metal interconnect is another one of nickel or aluminum.

In yet another embodiment, a method for forming a semiconductor structure, includes forming a first nickel layer over a first dielectric layer; forming a first graphene layer surrounding the first nickel layer; forming a second dielectric layer over the first nickel layer and the first graphene layer; forming an opening in the second dielectric layer which exposes the first nickel layer; forming a second nickel layer over the second dielectric layer and within the opening; and forming a second graphene layer surrounding the second nickel layer, wherein the first graphene layer is in contact with the second graphene layer within the opening. In one aspect of the yet another embodiment, forming the first graphene layer includes exposing the first nickel layer to a carbon-containing gas or paste such that the carbon diffuses through the first nickel layer to form the first graphene layer surrounding the first nickel layer.

What is claimed is:
1. A semiconductor structure comprising:
   a first metal interconnect over a first dielectric layer;
   a first graphene layer on at least a bottom major surface of the first metal interconnect such that the first graphene layer is between the first metal interconnect and the first dielectric layer;
   a second dielectric layer over the graphene layer and the first metal interconnect;
   a second metal interconnect over the second dielectric layer and extending through the second dielectric layer to electrically contact the first metal interconnect; and
   a second graphene layer on at least one major surface of the second metal interconnect, wherein the first graphene layer surrounds the first metal layer and the second graphene layer surrounds the second metal layer, wherein the first graphene layer contacts the second graphene layer in the opening.

2. The semiconductor structure of claim 1, wherein the first metal interconnect and second metal interconnect comprise nickel.

3. The semiconductor structure of claim 1, wherein the first graphene layer is on a top major surface of the first metal interconnect, on the bottom major surface of the first metal interconnect, and at least a side surface of the first metal interconnect.

4. The semiconductor structure of claim 1, further comprising:
   a third metal interconnect with a third graphene layer surrounding the third metal interconnect, wherein the third graphene layer is on the first graphene layer, and wherein the first metal and the third metal are different metals.

5. The semiconductor structure of claim 1, wherein the first metal interconnect is one of nickel or aluminum and the third metal interconnect is another one of nickel or aluminum.

6. The semiconductor structure of claim 1, wherein the first metal interconnect is one of nickel, aluminum, titanium, or tungsten and the third metal interconnect is another one of nickel, aluminum, titanium, or tungsten.

7. A semiconductor structure comprising:
   a first metal interconnect over a first dielectric layer;
   a first graphene layer on at least one major surface of the first metal interconnect;
   a second dielectric layer over the graphene layer and the first metal interconnect;
   a second metal interconnect over the second dielectric layer and extending through the second dielectric layer to electrically contact the first metal interconnect;
   a second graphene layer on at least one major surface of the second metal interconnect;
   a third dielectric layer over the second metal interconnect and second graphene layer; and
   a void between the third dielectric layer and a portion of the second metal interconnect which extends to the electrically contact the first metal layer.

8. The semiconductor structure of claim 7, wherein the first graphene layer surrounds the first metal interconnect and the second graphene layer surrounds the second metal interconnect.

9. The semiconductor structure of claim 8, further comprising:
   a third metal interconnect with a third graphene layer surrounding the third metal interconnect, wherein the third graphene layer is on the first graphene layer, and wherein the first metal and the third metal are different metals.

10. The semiconductor structure of claim 8, wherein the first metal interconnect is one of nickel or aluminum and the third metal interconnect is another one of nickel or aluminum.

11. A semiconductor structure comprising:
    a first metal interconnect over a first dielectric layer;
    a first graphene layer on at least one major surface of the first metal interconnect;
    a second dielectric layer over the graphene layer and the first metal interconnect;
    a second metal interconnect over the second dielectric layer and extending through the second dielectric layer to electrically contact the first metal interconnect; and
    a second graphene layer on at least one major surface of the second metal interconnect, wherein the first graphene layer surrounds the first metal interconnect and the second graphene layer surrounds the second metal interconnect; and a third metal interconnect with a third graphene layer surrounding the third metal interconnect, wherein the third graphene layer is on and in physical contact with the first graphene layer, and wherein the first metal and the third metal are different metals.

12. The semiconductor structure of claim 11, wherein the first metal layer is one of nickel, aluminum, titanium, or tungsten and the third metal layer is another one of nickel, aluminum, titanium, or tungsten.

* * * * *